(12) United States Patent
Gerlovin et al.

(10) Patent No.: US 7,006,956 B1
(45) Date of Patent: *Feb. 28, 2006

(54) INTEGRATION OF AN ANALYSIS INTO THE FEATURES OF A MODEL OF AN OBJECT

(75) Inventors: Emmanuel Gerlovin, Wayland, MA (US); Dmitriy Shkolnik, Andover, MA (US); Jose A. Cro Granito, Stoneham, MA (US)

(73) Assignee: Parametric Technology, Corporation, Cassadaga, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/316,549

(22) Filed: May 24, 1999

(51) Int. Cl.
*G06G 7/48* (2006.01)

(52) U.S. Cl. .......................................... 703/6
(58) Field of Classification Search ..................... 703/6
See application file for complete search history.

(56) References Cited

U.S. PATENT DOCUMENTS 5,323,333 A * 6/1994 Johnson ......................... 703/1
5,552,995 A * 9/1996 Sebastian ..................... 700/97

FOREIGN PATENT DOCUMENTS

| EP | 0 350 578 | 1/1990 |
| EP | 0425172 A2 | 10/1991 |
| GB | 2 332 963 | 7/1999 |
| WO | WO 9855949 | 12/1998 |
| WO | WO 9944107 | 9/1999 |

OTHER PUBLICATIONS

Rabemanantsoa et al.; "Knowledge-based system for assembly process-planning"; IEEE, 1993; pp. 267-272.*
Kalyan-Seshu et al.; "Towards computer aided design for the life cycle"; IEEE ISEE-1998; May 1998; pp. 310-315.*
Parametric Technology Corporation Web Site printouts disclosing "Pro/Engineer" and "Pro/Intrlink", Dec. 1997; hand numbered pp. 1-29.*
Pro/Engineer "Part Modeling User's Guide" Parametric Technology Corporation. Chapter 3, pp. 3-60-3-62 (1998).
Jami J. Shah et al. Parametric and Feature-Based CAD/CAM "Concepts, Techniques, and Applications" Oct. 95, pp. 1-121.

* cited by examiner

*Primary Examiner*—Hugh Jones
(74) *Attorney, Agent, or Firm*—Lahive & Cockfield, LLP

(57) ABSTRACT

An analysis may be represented as a feature in a feature-based model of a geometric object. The analysis is integrated directly into the model and may be recalculated in response to changes made to the model. Additional features may be created that reference the analysis feature. Likewise, the model may include features that reference the analysis without directly incorporating the analysis into the model as a feature. The analysis may be a system-defined analysis, a user defined analysis or an external analysis.

26 Claims, 9 Drawing Sheets

INTEGRATION OF AN ANALYSIS INTO THE FEATURES OF A MODEL OF AN OBJECT

TECHNICAL FIELD

The present invention relates generally to computer systems and more particularly to the integration of an analysis into the features of a computer-aided design model of an object.

BACKGROUND OF THE INVENTION

Computer-aided design (CAD) refers to the use of computers to assist designers in the designing of a product. The designer uses a CAD system to identify the geometry and other critical characteristics of the product. Most conventional CAD systems create models of the products that capture the geometric characteristics of the product, such as the geometry of the product. Such models are provided in a number of different varieties. "Feature-based models" represent products as combinations of "features." A "feature" is a set of data and procedures for generating shape or characteristic of a product that can be associated with certain attributes and knowledge about the product. In general, features serve as the building blocks for product modeling.

Some conventional CAD systems generate "parametric models." Parametric models represent models as sets of procedures having input parameters such as dimension values and output geometry. A parametric model stores a procedure for constructing the computer model of a product. In parametric models, the procedure for constructing the product may be viewed as a sequence of assignments to model variables as a function of input parameters for parametric equations. To create parametric variations, the construction procedure is reevaluated after changing the values of the input parameters (such as dimension values). This general definition of "parametric models" includes "variational models" or "variable-driven models" generated by some conventional CAD systems.

As part of the design of a product, it is often necessary to perform analysis, such as engineering analysis, on the model of the product. Often, separate application programs are run to perform analysis on a product. The designer must then view the analysis and manually make appropriate changes to the model to obtain the desired analysis results. Some conventional CAD programs provide some analysis tools in the CAD package. In such cases, the analysis results are not integrated into the model but rather exist as separate data in the CAD package. As a result, it is often difficult for a designer to work with the model and the engineering analysis simultaneously.

SUMMARY OF THE INVENTION

The present invention addresses the limitations of conventional CAD systems by integrating analyses into the models of products. In particular, the present invention captures an analysis inside the feature mechanism to generate reproducible referenceable parameters and/or geometric entities that describe the results of the analysis. In one embodiment of the present invention, an analysis is represented as a feature that is part of a model of a product. Because the analysis is integrated into the feature-based model, when a change in the model that requires updating of the analysis occurs, the analysis is automatically updated and the associated feature is updated. In this embodiment of the present invention, a new type of feature is defined to represent an analysis, such as an engineering analysis. This feature serves as a placeholder for such analysis.

In accordance with another aspect of the present invention, a method is practiced in a computer-aided design (CAD) system. In accordance with this method, a feature-based model of an object is provided, along with an analysis for acting on at least a portion of the model. A feature is created that contains the analysis, and the feature is added to the model of the object. The analysis may be an engineering analysis, for example. The results of the analysis may be used to determine the values of parameters and the position of some geometric entities within the model.

In accordance with a further aspect of the present invention, an analysis is performed within a feature of a feature-based model of an object to yield results. An analysis feature is created based on the results. The model is modified so that when the analysis is performed again on the model, new results are yielded. The feature is automatically updated based on the new results.

In accordance with yet another aspect of the present invention, a CAD system includes an analysis for application to at least a portion of a feature-based model of an object to yield results. The CAD system also includes a feature generator for generating features for the model, including at least one feature that contains the analysis.

In accordance with an additional aspect of the present invention, a parametric feature-based model of an object is provided in a computer system. An analysis is also provided in the computer system. The analysis is applied to the parametric feature-based model to produce results. Based on the analysis and the results, a determination is made whether the parametric feature-based model satisfies a requirement. The requirement may be, for example, an engineering requirement. Then, based on the results of this determination, the system automatically performs some action.

The action that is automatically taken based on the results of the determination may vary depending upon the application. Suppose that an analysis is applied when the input parameters to the model are changed, resulting in the updating of the model. The updating of the model results in an updated analysis. A determination is made if the requirement is satisfied. If the requirement is not satisfied, the input parameters are changed and the process is repeated until this requirement is satisfied. In a second example, features are added or removed from the model. The analysis is performed and the determination is made if the requirement is satisfied. Features are added or removed until the requirement is satisfied. In a third instance, the user is notified based on the results of the determination and an action or a decision is requested from the user.

In accordance with another aspect of the present invention, a method is practiced in a CAD system that has a parametric feature-based model of an object. In accordance with this method, an analysis is provided to be applied to the parametric feature-based model. The analysis is applied to the model multiple times with different values of selected parameters to produce results. At least one of the values for the selected parameter is chosen based on some criteria and the results from applying the analysis to the model multiple times.

In accordance with a further aspect of the present invention, a computer system includes a feature-based model of an object. An analysis is provided for application to at least a portion of the model to yield results. A feature is created that references the analysis, and the feature is incorporated into the model without incorporating the analysis into the model. The computer system may run a CAD system.

BRIEF DESCRIPTION OF THE DRAWINGS

An illustrative embodiment of the present invention will be described below relative to the following drawings.

DETAILED DESCRIPTION OF THE INVENTION

Figure 1:
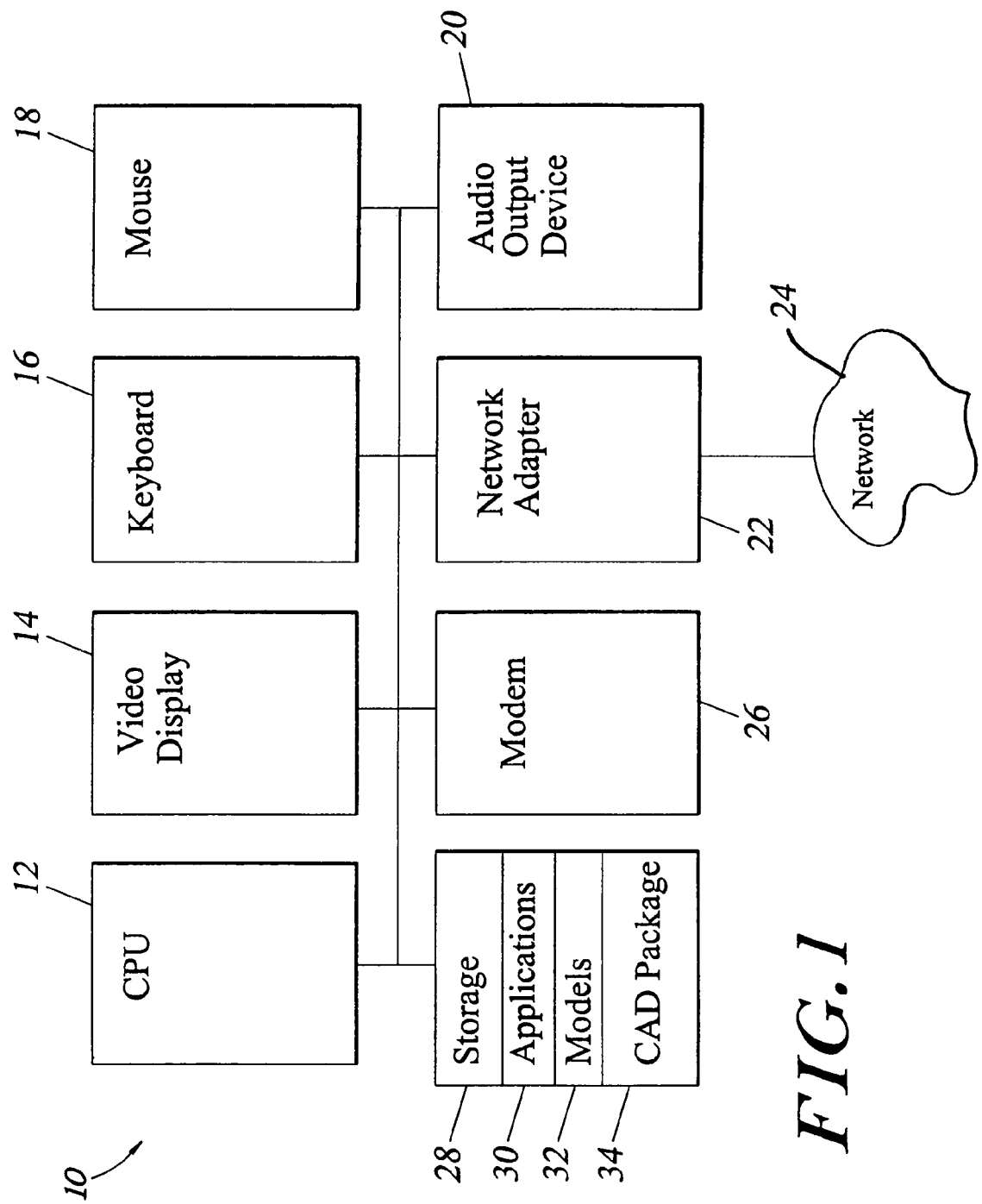
FIG. 1 depicts a block diagram of a computer system that is suitable for practicing the illustrative embodiment of the present invention.

The illustrative embodiment of the present invention is realized as part of a CAD/CAM package, such as Pro/ENGINEER 2000i, which is sold by Parametric Technology Corporation of Waltham, Mass. The illustrative embodiment provides the ability to integrate an analysis into a feature-based model. The analysis may be represented by a special type of feature in the model. In addition, additional features may be defined relative to the analysis feature.

This integration provides the ability to capture requirements for a product in terms of the feature language of the model. The result is that an analysis can be captured inside a feature and subsequently used. For example, a feature can be defined to compute an analysis that identifies where the center of gravity of an object is. The result of this analysis identifies the center of gravity, and the feature may be defined to add a point or a coordinate system at the center of gravity. This integration provides a powerful mechanism for more closely tying the analysis to the modeling of the product.

The illustrative embodiment will be described below relative to implementations concerning an engineering analysis. Nevertheless, those skilled in the art will appreciate that the present invention may also apply to other implementations when the analysis performs steps other than those typically found in the engineering analysis.

The illustrative embodiment is described below relative to an implementation in a CAD/CAM package. Those skilled in the art may appreciate that the present invention may be implemented also with other types of software packages. The present invention may be implemented with a CAD package and more generally with other type of software that utilizes models of geometric objects (e.g. a graphical modeling program).

In the illustrative embodiment, products or geometric object are represented by feature-based models. Each feature-based model contains a set of features that define components of the model. The features serve as the basic building blocks for the models. The features have knowledge of their environment and act predictably to change. The models are procedural parametric models such that the construction sequences for the models are stored and maintained, and each feature has an associated procedure for implementing the feature.

The encapsulation of an analysis within a feature greatly enhances the capabilities of the CAD system in the illustrative embodiment of the present invention. This encapsulation allows the CAD system to verify whether a design satisfies engineering requirements. In particular, engineering requirements may be specified as required values for the results of an analysis. The encapsulation also enables the CAD system to determine the values of input parameters to a parametric model such that the engineering requirements are satisfied. Alternatively, the encapsulation allows the CAD system to determine values of the input parameters to a parametric model such that the results of the analyses are optimal in some specified sense.

For purposes of the discussion below it is helpful to define a few terms.

A "model" refers to a representation of an object.

The terms "feature-based model" and "parametric model" are used in the discussion below as defined above in the Background of the Invention.

A "geometric object" refers to an entity that has an associated geometry. A "list of geometric objects" may include but is not limited to a list of points, coordinate systems, axes, planes, curves, surfaces, scalar fields and/or vector fields.

FIG. 1 depicts a block diagram of a computer system 10 that is suitable for practicing the illustrative embodiment of the present invention. Those skilled in the art will appreciate that the configuration of the computer system 10 shown in FIG. 1 is intended to be merely illustrative and not limiting of the present invention. The computer system 10 may be realized as a network computer, a personal computer, a portable computer, a mini-computer, a mainframe computer, a workstation or other type of computer system. Moreover, the computer system 10 may be realized as a distributed computer system or as a tightly coupled multiprocessor system.

The computer system 10 shown in FIG. 1 includes a central processing unit (CPU) 12 for executing instructions and overseeing operation of the computer system. The computer system 10 may include a number of peripheral devices, such as a computer display 14, a keyboard 16, a mouse 18 and an audio output device 20. Those skilled in the art will appreciate that a different number of peripheral devices than shown in FIG. 1 may be used to practice the present invention and that different types of peripheral devices than shown in FIG. 1 may be used to practice the present invention. The computer system 10 may additionally include a network adapter 22 for interfacing with a computer network 24, such as a local area network (LAN). The computer system 10 may also include a modem 26 for interfacing with telephone lines, cable lines or wireless communication pathways so that the computer system may communicate with remote computing resources.

The computer system 10 includes a storage 28, which may include both primary storage and secondary storage. The storage 28 may include computer-readable media such as floppy disks, optical disks, magnetic disks and the like.

These media may be removable media or permanent media. The storage 28 holds application programs 30 and the CAD package 34. The storage also holds a number of models 32 representing assemblies, parts, mechanisms and the like.

Figure 2:
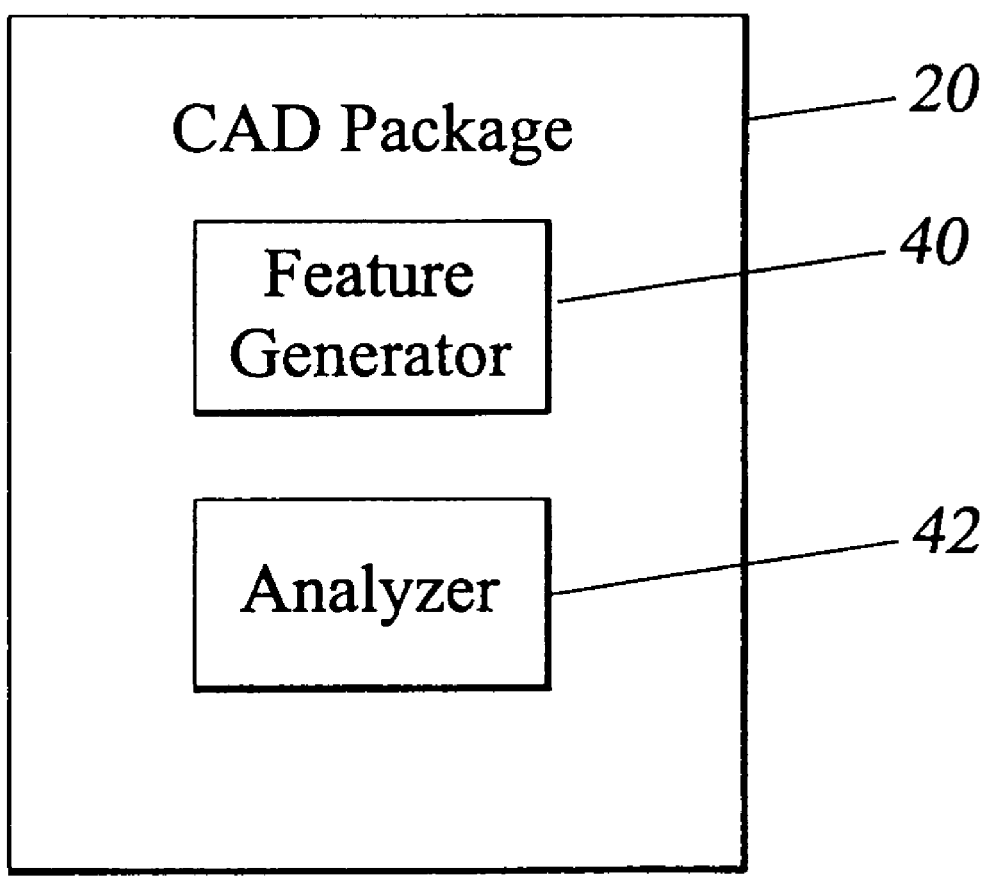
FIG. 2 depicts logical components of the CAD package of FIG. 1 that are used in the illustrative embodiment.

FIG. 2 depicts a couple of the logical components of the CAD package 34 that are of particular interest to the illustrative embodiment of the present invention. The CAD package 34 includes a feature generator 40 for generating features and editing features that are part of the models 32. The CAD package 34 also includes an analyzer 42 for performing analyses. In general, the CAD package 34 provides a mechanism for a user to apply a number of different analyses to a model. Moreover, the user has the ability to custom define analyses as needed or use external applications to execute analyses.

Figure 3:
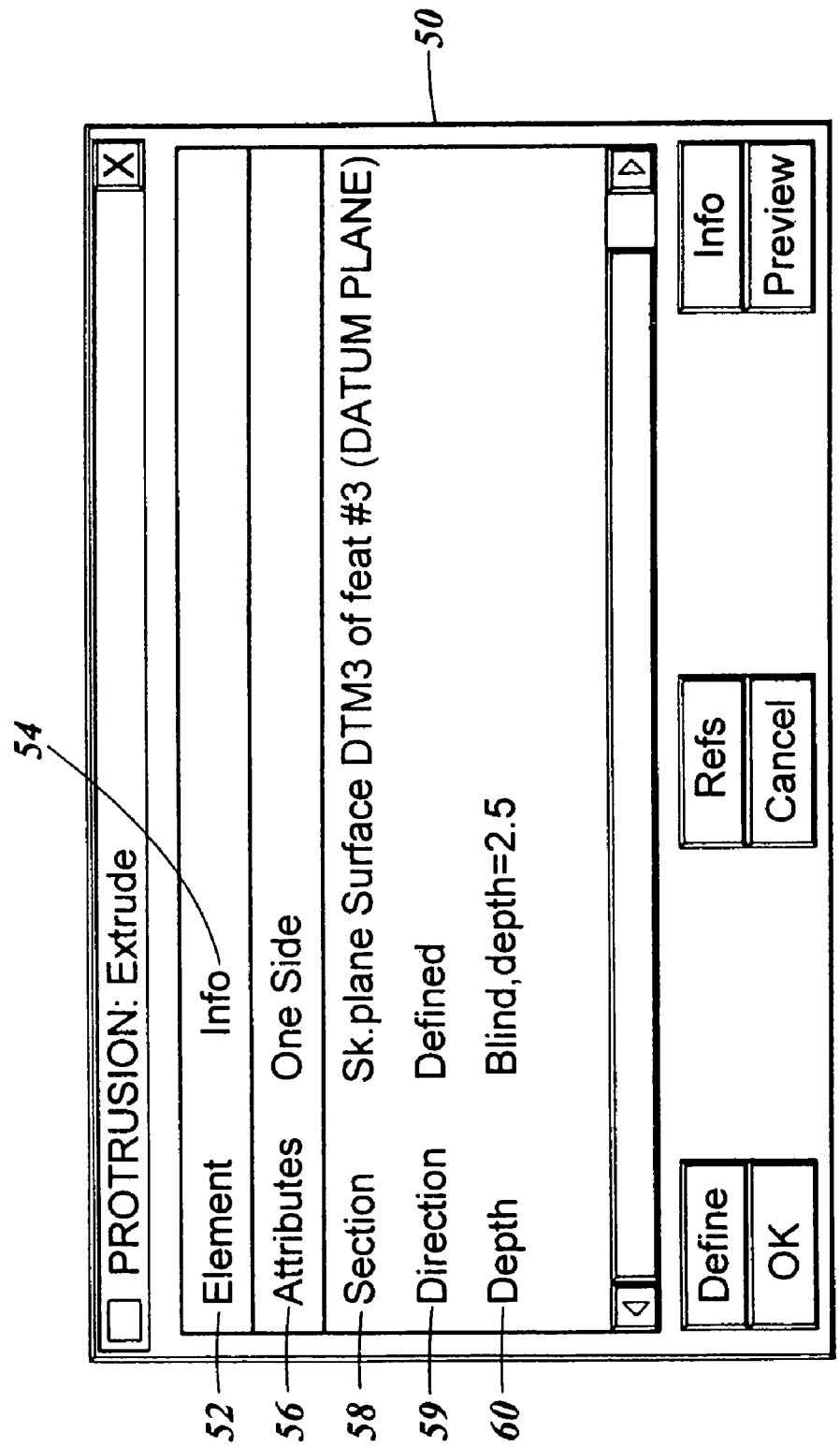
FIG. 3 depicts a feature dialog box.

As mentioned above, the illustrative embodiment employs a feature-based model. Examples of features include extrusions, cuts, holes, slots, rounds and the like. Features are specified by setting values for attributes, such as reference planes, surfaces, direction of creation, pattern parameters, shape, dimensions and the like. The system specifies feature types and each instance of a feature of a given feature type must have a required set of attributes specified. The dialog box in FIG. 3 illustrates the attributes values used for a feature "protrusion" that is generated by extruding a two-dimensional shape in some direction. The dialog box includes an element column 52 and an information column 54. The feature dialog box 50 includes separate rows 56, 58 or 60 for the separate attributes. The value in the element column 52 identifies the nature of the attributes and the values in the information column 54 explain the values associated with the attribute. The "one side" depth option value in row 56 specifies that the location of the extruded feature is specified with respect to one side of the plane of the two-dimensional shape. The section information in row 58 orients the plane. The direction of feature creation is "defined" (see row 59), and the depth element is specified as a blind feature with a depth of 2.5 in row 60.

Figure 4:
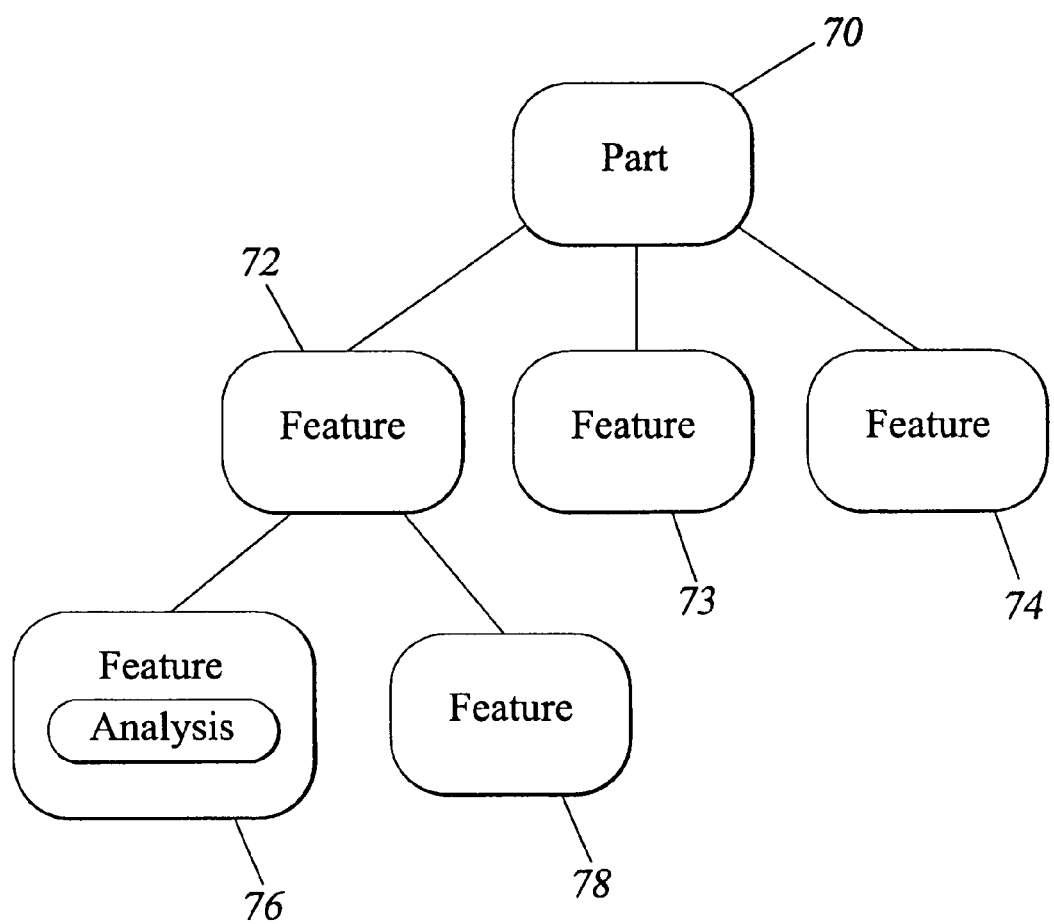
FIG. 4 depicts a hierarchy of elements in an example part.

The models for products are composed hierarchically such that each model is a sequence of features. The sequence corresponds with the sequence used in constructing the model. FIG. 4 shows an example when a part 70 includes features 72, 73, 74, 76 and 78. Feature 76 contains an analysis (i.e. an analysis is part of the features). Thus, the analysis is directly integrated into the feature-based model mechanism of the illustrative embodiment.

The CAD package 34 provides a menu that allows the creation of features. A dialog box like dialog box 50 shown in FIG. 3 may be displayed to allow the designer to define features. The CAD package 34 also allows the designer to identify where the feature is positioned within the hierarchy for the model. In other words, the designer can choose where the feature fits within the tree that represents the model (see, for example, FIG. 4).

Figure 5:
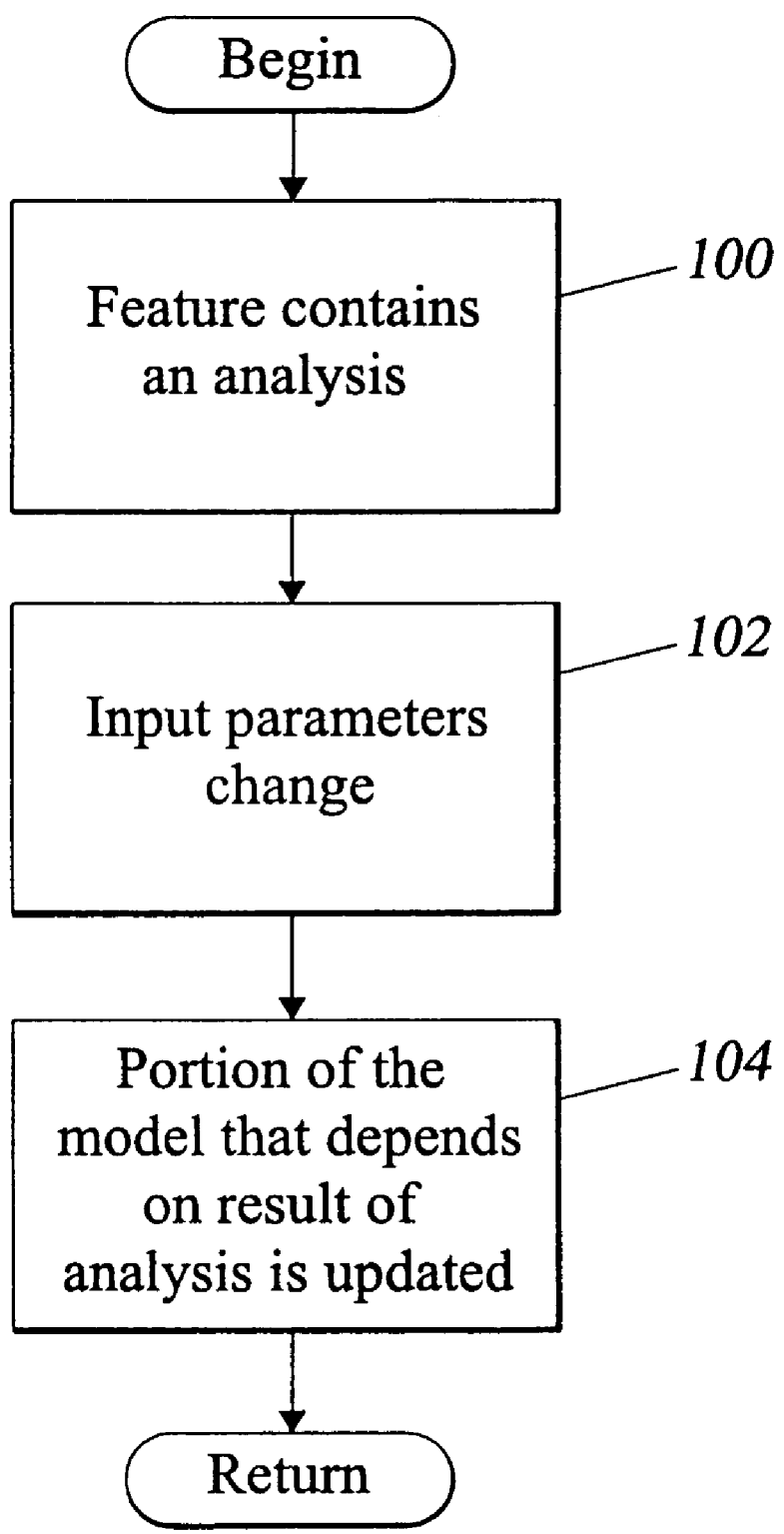
FIG. 5 is a flow chart illustrating steps that are performed when the input parameters to the model change and the model is updated.
Figure 6A:
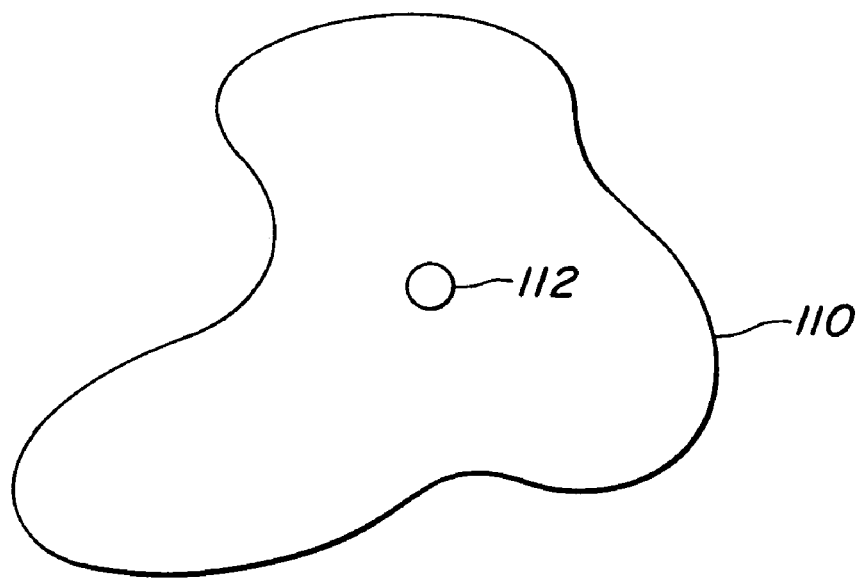
FIG. 6A depicts a first example of a geometric representation wherein a feature contains an analysis.
Figure 6B:
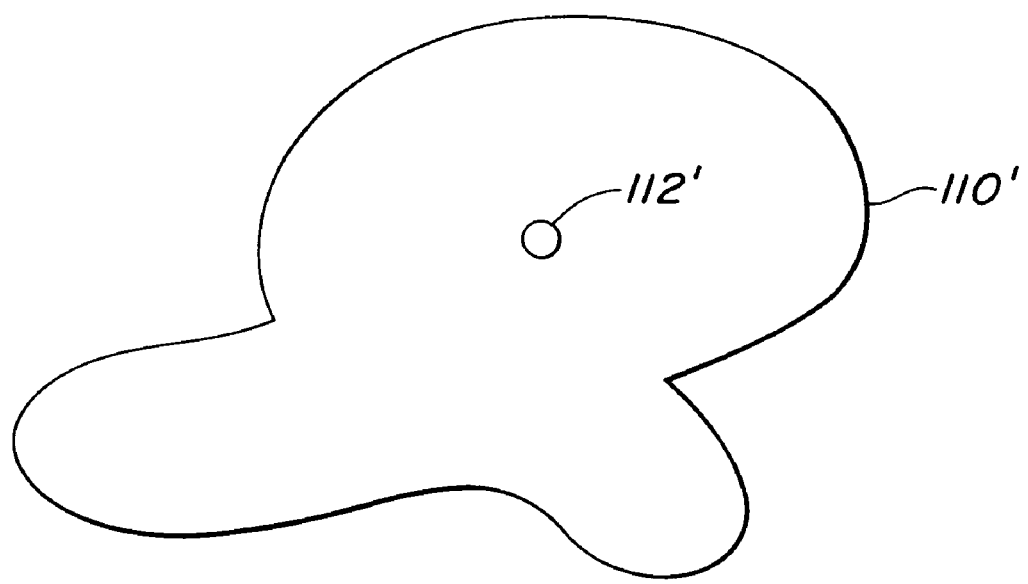
FIG. 6B depicts an updated geometric representation of the representation of FIG. 6A.

One benefit of integrating an analysis into a feature-based model is that a feature that contains the analysis is automatically updated by re-computing the analysis when the model changes. As shown in FIG. 5, a feature is provided in a model that contains an analysis (step 100 in FIG. 5). For example, suppose that a model has a geometric representation 110 as shown in FIG. 6A. The model contains a feature for a hole 112 that is drilled at the center of gravity of the object. The location of the center of gravity is computed with an analysis feature which generates a point or a coordinate system at this location. The hole, which is also represented as a feature, is placed with respect to the point or coordinate system generated by the analysis feature. In a different implementation, the hole may be represented as a feature that contains the analysis for calculating the center of gravity. When the input parameters to the model change (step 102 in FIG. 5), the features of the model must be regenerated. Suppose that the model is changed to have the geometry of the geometric representation 110' shown in FIG. 6B. This change in the geometric representation 1.10 causes the center of gravity to change as well. Thus, when the drill hole is updated, the newly generated drill hole 112' is at the newly calculated center of gravity. Hence, as part of the updating the model, the analysis is again performed (step 104 in FIG. 5), and the hole feature updates its placement accordingly (step 106 in FIG. 5). This update is performed automatically by the CAD package without user prompting.

Figure 7:
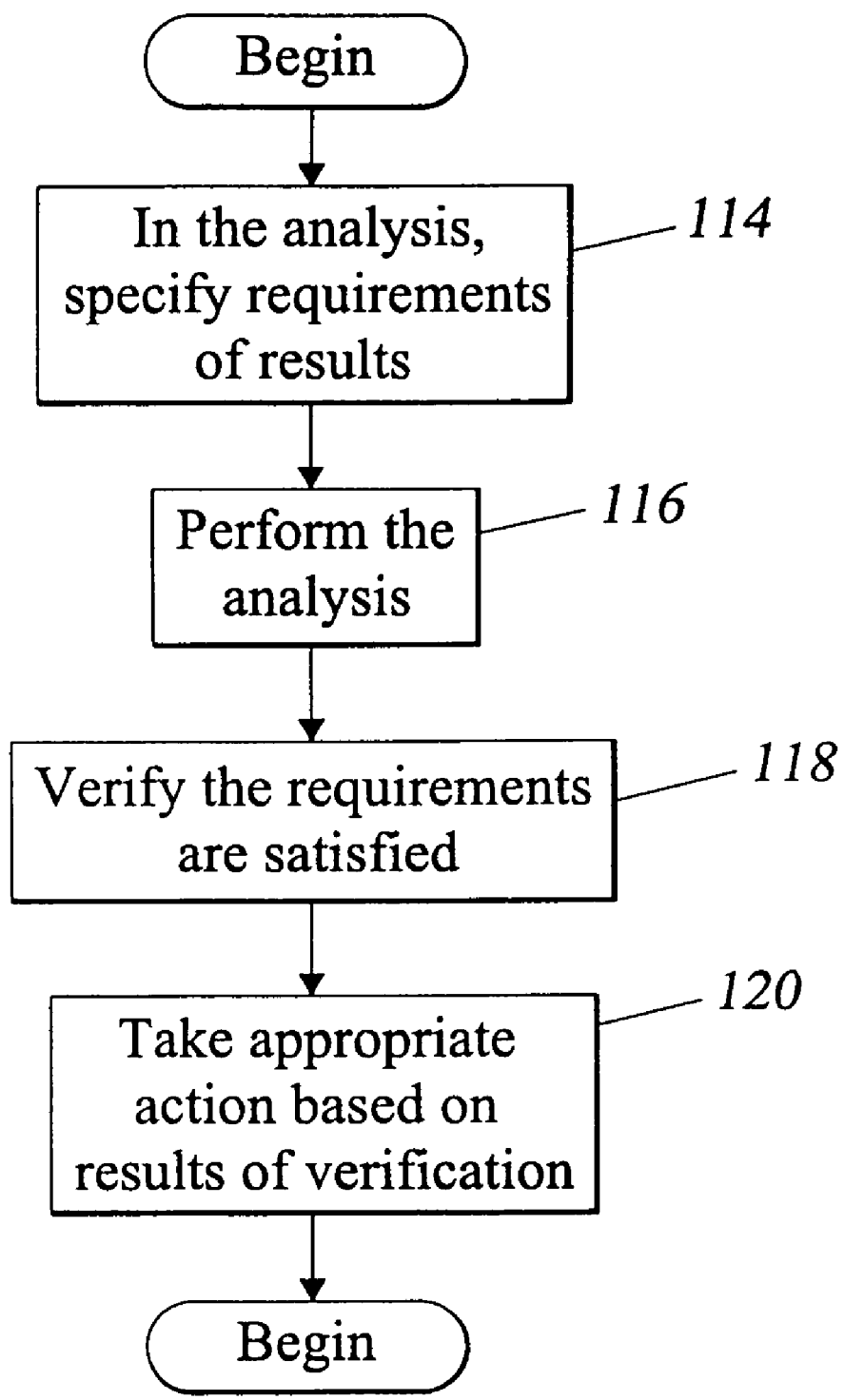
FIG. 7 depicts a flow chart illustrating the steps that may be performed to verify that a product meets engineering requirements in the illustrative embodiment of the present invention.

Integration of the analysis into the feature-based model provides a number of capabilities. One of these capabilities is the ability to verify whether a design satisfies certain engineering requirements. In particular, as shown in the flow chart of FIG. 7, the analysis may specify requirements for the results of the analysis (step 114 in FIG. 7). The analysis is performed (step 116 in FIG. 7), and the results of the analysis verify whether the requirements are satisfied or not (step 118 in FIG. 7). Based on the results of the verification the appropriate action is automatically taken (step 120 in FIG. 7).

Figure 8A:
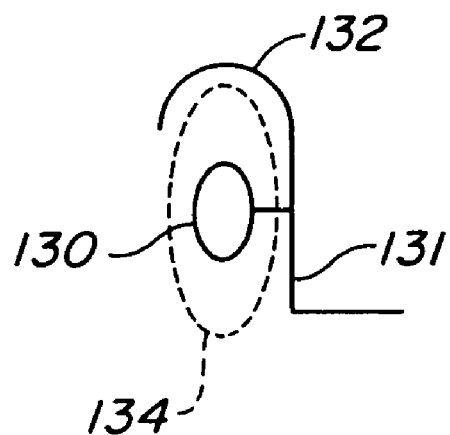
FIGS. 8A and 8B illustrate two examples of an assembly to illustrate how an analysis may be used to verify that a design satisfies certain engineering requirements.
Figure 8B:
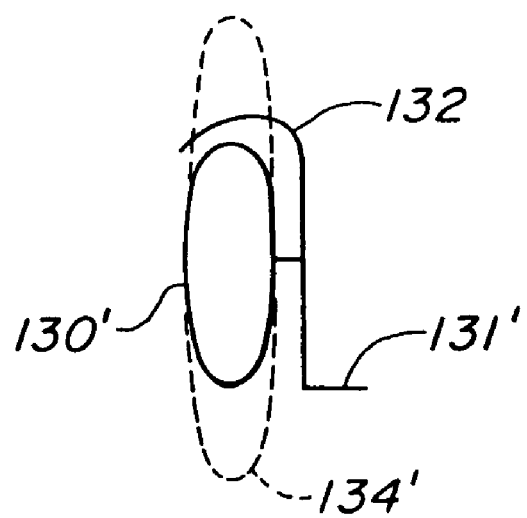

FIGS. 8A and 8B illustrate examples where the analysis may be used to verify whether engineering requirements are satisfied or not. In the example of FIG. 8A, an assembly 131 includes a sub-assembly 130 that moves relative to the rest of the assembly. A motion envelope 134 captures the range of motion of the sub-assembly 130. The analysis may be utilized to identify the motion envelope 134. The analysis may also determine whether this motion envelope 134 interferes with structure 132 in the assembly 131. In the example shown in FIG. 8A there is no interference. However, in the example shown in FIG. 8B, the moving sub-assembly 130' is larger and will interfere with structure 132 in the assembly 131'. The motion envelope 134' intersects with the structure 132 and indicates that the sub-assembly will interfere with another portion of the assembly 131'. The analysis may be utilized to make such a determination. The results of such determination may then be used to take the appropriate action such that the conditions of FIG. 8B change to those of FIG. 8A and the engineering requirements are satisfied.

Figure 9:
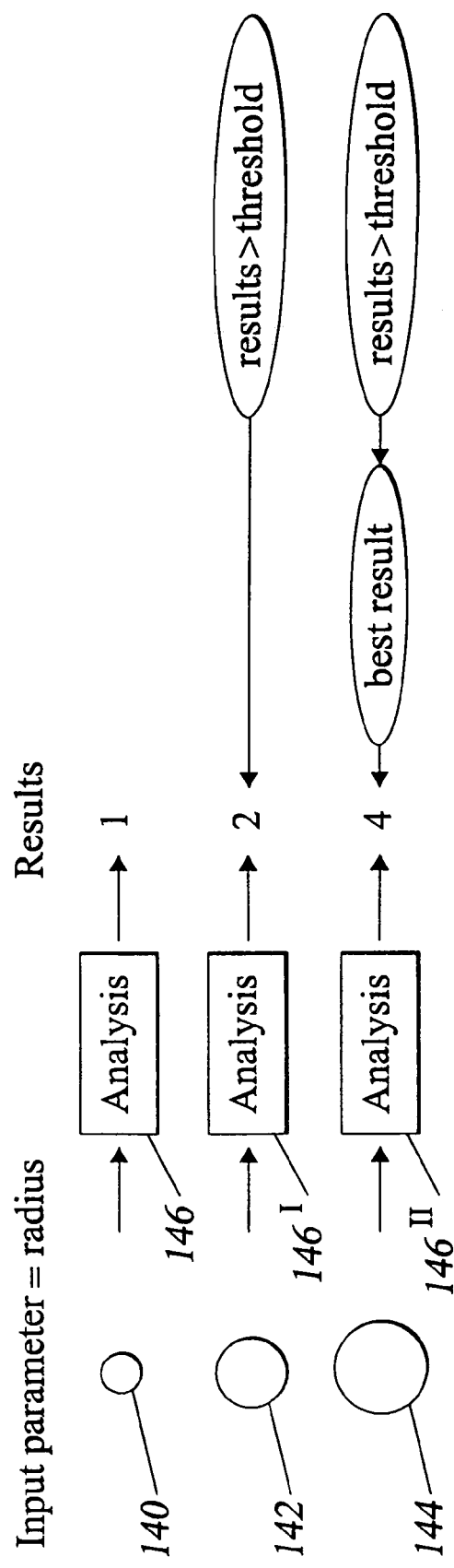
FIG. 9 is an example illustrating how an analysis may be used to identify optimal engineering requirement results or to identify that certain input parameters satisfy engineering requirements.

The analysis and the results of the analysis may also be used to choose a best result or to choose whether results can fulfill certain engineering requirements. In the example depicted in FIG. 9, a circular part has an input parameter that specifies a radius of the circle part. Three input parameter choices are represented by circles 140, 142 and 144. A separate instance of an analysis 146, 146' and 146" is applied to each of the respective choices 140, 142 and 144 to yield scored results. These results may then be processed to determine the best scoring or optimal results according to the criteria chosen. In this particular case the criteria is to maximize the result. In the example case the result of "4" is the largest result and therefore the optimal result. Hence, the score of "4" has been labeled as a best result in FIG. 9. The analysis may also be used to determine whether various input parameters satisfy engineering requirements. In this example, the engineering requirements are that the results of the analysis produce a value that is greater than 1. Thus, the results of "2" and "4" are results that are greater than the threshold value.

Other examples illustrate how the analysis may be utilized. For example, a desired flow rate through an intake manifold on an engine can now drive the defining cross section of a pipe in the intake manifold. Further, an angle of light reflectivity off a surface could be measured and captured within a feature to ultimately drive the curvature of the surface in the design.

While the present invention has been described with reference to an illustrative embodiment thereof, those skilled in the art will appreciate that various changes in form and detail may be made without departing from the intended scope of the present invention as defined in the appended claims.

What is claimed is:

1. In a computer-aided design (CAD) system, a method, comprising the computer-implemented steps of:
   providing a feature-based model of an object;
   providing an analysis for acting on at least a portion of the model;
   creating at least one feature in the model that contains the analysis, said feature containing the analysis updating automatically without user intervention following a re-computation of the analysis initiated by a change in the model of the object; and
   adding the feature to the model of the object.

2. The method of claim 1 wherein the analysis is an engineering analysis.

3. The method of claim 1 further comprising the step of performing the analysis on the model to yield results.

4. The method of claim 3 wherein the results of the analysis comprise graphical information.

5. The method of claim 3 further comprising the steps of displaying the results of the analysis.

6. The method of claim 1 wherein the analysis is provided by the CAD system.

7. The method of claim 1, comprising the further steps of:
   performing the analysis using an external program other than the CAD system, said analysis occurring prior to the creation of a feature adding the analysis.

8. The method of claim 1 wherein a user of the CAD system defines and provides the analysis.

9. In a computer-aided design (CAD) system having a feature-based model of an object, a method comprising the computer-implemented steps of:
   performing an analysis on the model to yield results;
   creating an analysis feature in said model based on the analysis and the results;
   modifying the model so that when the analysis is performed again on the model new results are yielded; and
   automatically updating the analysis feature based on the new results.

10. The method of claim 9 wherein the analysis is an engineering analysis.

11. The method of claim 9 wherein the analysis feature creates output and wherein at least some of the output of the analysis feature is changed in the automatic updating.

12. In a computer system, a method comprising the computer-implemented steps of:
   providing a parametric feature-based model of an object;
   incorporating an analysis that is applied to the parametric feature-based model to produce results into a feature of the parametric feature-based model, said feature containing the analysis updating automatically without user intervention following a re-computation of the analysis initiated by a change in the model of the object;
   applying the analysis to the parametric feature-based model to produce results;
   based on analysis and the results, determining whether the parametric feature-based model satisfies a requirement; and
   based on this determination, performing an action.

13. The method of claim 12 wherein the computer system includes a computer-aided design (CAD) package that provides the parametric feature-based model.

14. The method of claim 13 wherein the analysis is user-defined by a user of the computer system.

15. The method of claim 13, comprising the further steps of: comprising the further steps of:
   performing the analysis using an external program other than the CAD package, said analysis occurring prior to said incorporating of the analysis into a feature of the parametric feature-based model.

16. In a computer-aided design (CAD) system that has a parametric feature-based model of an object, a method comprising the steps of:
   providing an analysis that is applied to the parametric feature-based model wherein the analysis produces results based on at least one set of values for a selected set of parameters of the model;
   applying the analysis to the model multiple times to produce results, each time with different sets of values for the selected set of parameters; and
   choosing at least one of the set of values for the selected sets of parameters based on the results from applying the analysis to the model multiple times, said analysis incorporated into a feature of the parametric feature-based model, said feature containing the analysis updating automatically without user intervention following a re-computation of the analysis initiated by a change in the model of the object.

17. The method of claim 16 wherein the values of the selected set of parameters that produces an optimal result are chosen.

18. The method of claim 16 wherein at least one of the sets of values of the selected parameters that produce results that satisfy a requirement are chosen.

19. In a computer-aided design (CAD) system having a feature-based model of an object, a computer-readable medium holding computer-executable instructions for performing a method, comprising the computer-implemented steps of:
   providing a feature-based model of an object;
   performing an analysis for acting on at least a portion of the model;
   creating at least one selected feature based on the analysis said feature containing the analysis updating automatically without user intervention following a re-computation of the analysis initiated by a change in the model of the object; and
   adding the selected feature to the model of the object.

20. The computer-readable medium of claim 19 wherein the analysis is an engineering analysis.

21. The computer-readable medium of claim 19 wherein the method further comprises the steps of performing the analysis on the model to yield results.

22. The computer-readable medium of claim 21 wherein the results of the analysis comprise graphical information.

23. In a computer-aided design (CAD) system having a feature-based model of an object, a computer-readable medium holding computer executable instructions for performing a method, comprising the computer-implemented steps of:

performing an analysis on the model to yield results;

creating an analysis feature in the model based on the analysis and the results;

modifying the model so that when the analysis is performed again on the model new results are yielded; and automatically updating the analysis feature based on the new result.

24. The computer-readable medium of claim 23 wherein the analysis is an engineering analysis.

25. The computer-readable medium of claim 23 wherein the analysis feature creates output and wherein at least one of the outputs of the analysis feature is changed in the automatic updating.

26. In a computer system having a feature-based model of an object having parameters, a computer-readable medium holding computer-executable instructions for performing a method, comparing the computer-implemented steps of:

performing an analysis on at least a portion of the model wherein the analysis produces results based on a set of values for a selected set of parameters of the model, said analysis incorporated as a feature in said model, the feature containing the analysis updating automatically without user intervention following a re-computation of the analysis initiated by a change in the model of the object;

applying the analysis to the model multiple times to produce results, each time with a different set of values for the selected parameter;

choosing the values for the selected set of parameters for which the result from applying the analysis are optimal; and creating at least one new feature in the model that references the optimal results of the analysis.

* * * * *

UNITED STATES PATENT AND TRADEMARK OFFICE
CERTIFICATE OF CORRECTION

| | | |
|---|---|---|
| PATENT NO. | : 7,006,956 B1 | Page 1 of 1 |
| APPLICATION NO. | : 09/316549 | |
| DATED | : February 28, 2006 | |
| INVENTOR(S) | : Emmanuel Gerlovin et al. | |

It is certified that error appears in the above-identified patent and that said Letters Patent is hereby corrected as shown below:

On the cover page, item [73] Assignee change "Parametric Technology, Corporation" to --Parametric Technology Corporation-- and change "Cassadaga, NY (US)" to --Needham, MA (US)--.

Signed and Sealed this

Twenty-third Day of February, 2010

David J. Kappos
*Director of the United States Patent and Trademark Office*